United States Patent [19]

Feely

[11] Patent Number: 5,034,304

[45] Date of Patent: Jul. 23, 1991

[54] PHOTOSENSITIVE COMPOUNDS AND THERMALLY STABLE AND AQUEOUS DEVELOPABLE NEGATIVE IMAGES

[75] Inventor: Wayne E. Feely, Rydal, Pa.

[73] Assignee: Rohm and Haas Company, Philadelphia, Pa.

[21] Appl. No.: 48,998

[22] Filed: May 8, 1987

Related U.S. Application Data

[63] Continuation of Ser. No. 818,430, Jan. 13, 1986, abandoned.

[51] Int. Cl.[5] .............................................. G03C 1/492
[52] U.S. Cl. .................................... 430/270; 430/191; 430/192; 430/291; 430/293
[58] Field of Search ............... 430/191, 192, 270, 291, 430/293

[56] References Cited

U.S. PATENT DOCUMENTS 3,692,560  9/1972  Rosenkranz et al. ............... 430/270
4,404,272  9/1983  Stahlhofen .......................... 430/270

Primary Examiner—Jack P. Brammer

[57] ABSTRACT

Selected photosensitive compounds activated by deep ultraviolet radiation or x-rays and capable of being employed at very low concentrations in photosensitive compositions are provided for producing thermally stable and aqueously developable, negative images on surfaces. The selected photosensitive compounds are halogenated organic compounds, including 1,1-bis[p-chlorophenyl]-2,2,2-trichloroethane, which generate an inorganic halogen acid upon exposure to deep UV or other short wavelength radiations. They may be used at concentrations of less than 5 weight percent of the total solids content of the photosensitive composition to produce aqueously developable negative images using deep UV exposure.

3 Claims, No Drawings

PHOTOSENSITIVE COMPOUNDS AND THERMALLY STABLE AND AQUEOUS DEVELOPABLE NEGATIVE IMAGES

This application is a continuation, of application Ser. No. 818,430, filed Jan. 13, 1986, now abandoned.

RELATED APPLICATIONS

This invention is related to my copending U.S. patent application Ser. No. 616,518 entitled *Thermally Stable Polymer Images and Processes* filed in the United States Patent and Trademark Office on June 1, 1984, now abandoned. The invention is also related to my copending U.S. patent application, filed simultaneously herewith, entitled *MICROPLASTIC STRUCTURES AND THEIR METHOD OF MANUFACTURE.*

FIELD OF THE INVENTION

This invention is directed to the discovery that certain known halogenated organic compounds which are extremely sensitive to certain types of short wavelength actinic radiation, such as deep ultraviolet light and x-rays, can be used to prepare aqueously developable negative images on surfaces. More particularly, these photoacid generating compounds can be employed in combination with acid hardening resin systems and photosensitive coating solutions containing such resin systems to produce aqueously developable, thermally stable and highly resolved negative images.

BACKGROUND OF THE INVENTION

Negative-acting, liquid-type photoresist compositions based upon cyclized rubber and containing diazide sensitizers are well known and are commonly employed in lithographic applications to form printing plate images. Their commercial acceptance in microelectronic applications, such as for creating micron size images on silicon wafers has, however, been limited by a number of technical problems. These problems include difficulties in obtaining high quality, pinhole-free, coatings of good uniformity and adhesion on substrate surfaces without the need for special surface preparation or other processing steps; inadequate thermal stability and resolution capability for the resulting images to be useful in many microelectronic applications, and especially in their need for organic solvents for developing the negative image.

For example, con entional negative acting photoresists employ rubbery thermoplastic polymers, such as polyisoprene and cyclized rubber, which require the use of organic solvents for development. When such negative resists are developed it has been found that the exposed thermoplastic material will swell in the organic solvent developer. The resolution of the images are thereby compromised and in some instances the images will become distorted and therefore unusable. Organic solvent developers are also undersirable for environmental, health and flammability reasons.

"DCOPA" is a copolymer containing glycidyl methacrylate and 2,3-dichloropropylmethacrylate. It has been reported to be useful as an x-ray sensitive photoresist material in "Recent Printing and Registration Results with X-Ray Lithography, B. Fay, L. Tai and D. Alexander, SPIE Vol. 537 (1985) pg. 57–68. DCOPA is a soft rubbery material which softens at low temperatures, on the order of less than 100° C., and is insufficiently resistant to plasma etching conditions used in subsequent wafer processing. This plasma etch resistance problem is inherent in aliphatic polymeric materials.

Novolak containing photoresist materials are substantially aromatic materials which exhibit good plasma etch resistance; however, they are not thermally stable nor are they sensitive to x-rays and other short wavelength radiation.

Workers in the microlithographic art are therefore seeking improved photoresists which are sensitive to short wavelength actinic radiation, are capable of high resolution, and are thermally resistant and resistant to plasma etching.

In my copending application Ser. No. 616,518, I described a dual acting, positive or negative, photosensitive composition containing an acid hardening resin system and a photoacid generator useful in the near ultraviolet radiation spectrum for preparing aqueously developable, thermally stable images. These dual acting photosensitive compositions result in images which are substantially more thermally stable than images formed by using conventional photoresist compositions such as those formed from novolak resins. The photoacid generators used in the dual acting photosensitive compositions of my previous invention were limited to those which were sensitive to near ultraviolet radiation ("near UV") having wavelengths on the order of form about 300 to about 500 nanometers and more particularly about 365 nanometers. Those near UV photoacid generators, such as diazonaphthoquinones, yield weak carboxylic acids, such as indenecarboxylic acid, when the photosensitive composition is exposed to near UV radiation. Those photoacid generators are typically present in the photosensitive composition at a concentration of from about 10 to 30 weight percent based on the total solids content of the photosensitive composition. The carboxylic acid photoacid generators used in combination with acid hardening resin systems of my prior invention were not found, however, to be sensitive to shorter wavelengths such as, deep ultraviolet radiation on the order of from about 210 to about 300 nanometers and more particularly 254 nanometers ("deep UV").

Compounds which generate strong inorganic acids, such as hydrochloric acid upon exposure to near UV radiation, as disclosed in U.S. Pat. Nos. 3,692,560; 3,697,274; 3,890,152; 4,404,272, were found to be unsuitable for use with acid hardening resins for aqueously developing both positive and negative, thermally stable images.

It was an object of the present invention, therefore, to provide photosensitive compounds, more properly referred to as photoacid generators, which are sensitive to short wavelength radiation such as deep UV or x-ray radiation and which can be used in combination with acid hardening resin systems for preparing aqueously developable, thermally stable and highly resolved negative images suitable for use in microelectronics applications.

SUMMARY OF THE INVENTION

I have found certain selected halogenated organic compounds to be highly sensitive to deep UV and other short wavelength actinic radiation. These photoacid generators are compatible with, and effective at low concentrations to catalyze the crosslinking of, acid hardening resins such that the combination can be used in a photosensitive composition to form highly resolved, thermally stable, and aqueously developable negative images on surfaces.

DETAILED DESCRIPTION OF THE INVENTION

The photoacid generators, which I found to be useful in combination with acid hardening resin systems to form thermally stable, highly resolved and aqueously developable, negative images on surfaces, were empirically selected from a broad class of halogenated organic compounds.

In order for a photoacid generator to be useful in the present invention it must meet a number of performance criteria:

1. The photoacid generator must be soluble in, or form a homogeneous solution with, the photosensitive coating solution containing the desired acid hardening resin system at a concentration sufficient to catalyze the crosslinking of the acid hardening resin system upon exposure and heating.
2. The photoacid generator must not phase separate from the acid hardening resin system when the resist is applied to the surface of a wafer.
3. The photoacid generator, when activated by actinic radiation, must be removable using a suitable aqueous base developer solution.
4. The photoacid generator must be non-reactive with the acid hardening resin system components in the absence of the selected exposing radiation or with the substrate surface itself;
5. The photoacid generator must have no adverse effect on the adhesion, uniformity or quality of the photosensitive coating, containing an acid hardening resin system, deposited on a substrate surface.
6. The photoacid generator must be capable of catalyzing the crosslinking of the acid hardening resin system in the photosensitive coating upon exposure to deep UV or other short wavelength radiation, and heating to an elevated temperature, while not prematurely catalyzing the crosslinking reaction at ambient temperature;
7. The photoacid generator must be capable of so catalyzing the crosslinking of the acid hardening resin system such that the negative image formed is thermally stable to temperatures in excess of 200° C.; and
8. The photoacid generator must be insensitive to radiation, other than the exposing radiation so that the photosensitive composition is stable upon storage.
9. The photoacid generator must not substantially evaporate from the resist during soft baking.
10. The photoacid generator, itself must be thermally stable so as not to generate acid during "soft baking" (as hereinafter defined).

It is known that all organic compounds having halogen substituents are potential candidates for use as photoacid generators if they are capable of generating a halogen acid upon exposure to actinic radiaton. To determine if a halogenated compound is potentially useful as a deep UV photoacid generator I reviewed the absorption spectra of some commercially available halogenated organic compounds. Literature on the properties of 1,1-bis[p-chlorophenyl]-2,2,2-trichloroethane, commonly known as DDT, and its isomers, analogs, homologs and residual compounds is available due to its previous use as an insecticide. H. C. A. Van Beck et. al., Ind. Eng. Chem. Process Res. Dev 21 123-125 (1982), and L. L. Miller et. al., J. Org Chem. 38 340 (1973). I found that DDT has an absorption maximum at about 250 nanometers. This wavelength is very close to the deep UV radiation generated by mercury lamps used in microelectronic imaging equipment. Accordingly I prepared a solution containing 2 weight percent DDT and an acid hardening resin system consisting of 20 weight percent Cymel 303 aminoplast and 80 weight percent of a commercial reactive hydrogen containing cresol-formaldehyde novolak resin dissolved in Shipley Microposit Thinner solvent. The DDT formed a homogeneous solution with the acid hardening resin composition. I then deposited the solution as a coating on a silicon wafer by spin coating the solution and then heating the coating at 90° C. for 30 minutes ("soft baked") to remove the solvent, leaving an adherent 1 to about 1.5 micron thick coating of good quality. I exposed the coating to a source of deep UV radiation having a wavelength of about 250 nanometers and an exposure dosage of about 10 millijoules per square centimeter ($mJ/cm^2$) through a standard metallized quartz photomask. After exposure the wafer was baked at 90° C. for 30 minutes. The unexposed areas were then removed using an aqueous base developer solution and the resulting images were examined and then slowly heated in a progressive step-wise manner to temperatures in excess of 300° C. The image quality and resolution was examined during this process. I found that thermally stable images of high resolution were maintained.

I then attempted to find out whether chemically related halogenated organic compounds were senstitive to deep UV and met the other performance criteria needed to function as a photoacid generator in combination with an acid hardening resin system to produce aqueously developable, thermally stable negative images using the screening process described above. I found that a correlation exists between the absorption spectra of halogenated organic compounds, their sensitivity to deep UV radiation and capability of being used with acid hardening resin systems. If the absorption maximum of the halogenated material is between about 210 nanometers, the lowest wavelength capable of being determined using conventional quartz containers and spectral analysis, and 299 nanometers, the material is a potential deep UV photoacid generator because this absorption maxima range is sufficiently close to the deep UV radiation produced with conventional imaging equipment. I examined halogenated organic compounds which had an absorption maximum in this range by following the procedure described above. I used the halogenatd organic compound at a concentration of 5 weight percent and exposed a coating formed from a photosensitive composition containing the potential photoacid generator and acid hardening resin to 254 nanometer deep UV at a dosage of 10 $mJ/cm^2$. While some potentially useful halogenated organic compounds which exhibited only a low level of absorption sensitivity to deep UV radiation in the 210 to 299 nanometer range were found to be useful as photoacid generators with acid hardening resin systems, other potentially useful photoacid generators having a similar absorption spectra maximum (low extinction coefficient) were found to be unsuitable for use as photoacid generators with acid hardening resin systems at the concentration, wavelength and dosage levels of the test. The absorption spectra of a halogenated organic compound, therefore, can only identify potentially useful photoacid generators but cannot be used to predict whether the halogenated organic compound can be used in combination with acid hardening resins to produce aqueously developable, highly resolved and thermally stable negative images using deep UV exposure. For example, certain halogenated organic compounds possess too high a vapor pressure to yield microlithographically consistent and acceptable negative images. Chloroform, for example, appreciably volatilizes upon the soft baking (90° C. for 30 minutes) step used to remove the solvent from the deposited coating. As a result, the final concentration of chloroform remaining in the coating may be too low to sufficiently catalyze the acid hardening reaction uniformly throughout the coating. In addition, slight coating thickness variations may also lead to differing concentrations of the photoacid generator in the coating such that the images which are formed crosslink to different degrees and yield inconsistent resolution (line widths) on the surface. Other potentially useful halogenated organic compounds were found to lack thermal stability; they did not resist generating acid during the softbaking step used to remove the solvent from the film. If the photoacid generator yields acid during the softbaking step the acid hardening resin system will crosslink prematurely. Premature crosslinking will lead to a crosslinked, non-imageable coating on the surface.

Therefore, in order for a photoacid generator to be useful in the present invention in combination with an acid hardening resin system it must also have a low enough vapor pressure such that substantially no evaporation of the photoacid generator occurs upon softbaking the coating and the photoacid generator must possess sufficient resistance towards premature activation during the softbaking step.

I have found a number of halogenated organic materials which are suitable for use as photoacid generators in combination with acid hardening resin systems to produce highly resolved, thermally stable, and aqueously developable negative images on deep UV exposure to doses of 10 mJ/cm$^2$ or less when employed in the photosensitive composition at a concentration of about 5 weight percent or less. These deep UV photoacid generators include:

1,1-bis [p-chlorophenyl]-2,2,2-trichloroethane (DDT);
1,1-bis [p-methoxyphenyl]-2,2,2-trichloroethane;
1,2,5,6,9,10-hexa bromocyclododecane;
1,10-dibromodecane;
1,1-bis[p-chlorophenyl]-2,2-dichloroethane;
4,4$^1$-dichloro-2-(trichloromethyl) benzhydrol or 1,1-bis(chlorophenyl)2-2,2-trichloroethane (Kelthane ®);
hexachlorodimethyl sulfone;
2-chloro-6-(trichloromethyl) pryidine;
0,0-diethyl-0-(3,5,6-trichloro-2-pyridyl)phosphorothioate (Dursban ®);
1,2,3,4,5,6-hexachlorocyclohexane;
N(1,1-bis [p-chlorophenyl]-2,2,2-trichoroethyl acetamide,
tris [2,3-dibromopropyl] isocyanurate;
2,2-bis [p-chlorophenyl]-1,1-dichloroethylene;
and their isomers, analogs, homologs, and residual compounds.

"Residual" compounds are intended to include closely related impurities or other modifications of the above halogenated organic compounds which result during their synthesis and which may be present in minor amounts in commercial products containing a major amount of the above compounds. Residual compounds include those known in the art such as for example those described in U.S. Pat. No. 2,812,280.

The preferred deep UV photoacid generators are those which are useful in combination with acid hardening resin systems at concentrations as low as about 0.1 weight percent when the exposure dosage of deep UV is 10 mJ/cm$^2$. The preferred deep UV photoacid generators are: DDT, Methoxychlor, Kelthane, and tris(2,3-dibromopropyl)isocyanurate.

In addition to evaluating and selecting halogenated organic compounds which are useful for forming thermally stable, aqueously developable, negative images using deep UV radiation, I also examined whether these photoacid generators in combination with acid hardening resins could be used to produce aqueously developable, thermally stable negative images using x-ray exposure. The illustrative examples which follow demonstrate the results of my experiments with x-ray exposure and negative image formation.

Some of the photoacid generators which were found to be useful as deep UV photoacid generators were not found to be useful as x-ray photoacid generators and two compounds, tris[2,3-dichloropropyl]phosphate and tris[2-chloroethyl]phosphate, which were not useful as deep UV photoacid generators were found to be useful as x-ray photoacid generators. When the photoacid generators were employed with the acid hardening resin system for x-ray imaging, the minimum concentration of the photoacid generator in the photosensitive composition was found to be much higher than when the same photoacid generator is used as a deep UV photoacid generator. The minimum concentration of the photoacid generator in the x-ray imagable photosensitive compositions was found to be about 10 weight percent and typically in the range of from about 10 weight percent to about 50 weight percent. Despite the need for much higher concentrations of photoacid generator in the acid hardening resin system when employing x-ray exposure rather than deep UV exposure, the resulting image resolution of the x-ray exposed negative resist was higher (more resolved) than for deep UV exposure. Because x-rays have very small wavelengths, on the order of about 0.1 to 10 nanometers, they inherently have the capability of yielding very highly resolved images. See *Introduction to Microlithography*, ACS Sys. Series No. 219, ACS, Washington, D.C. 1983 p. 138–140. This reference also correlates x-ray sensitivity to electron beam and proton beam sensitivity. The conclusion reached is that the basic radiation chemistry which an x-ray resist undergoes is the same for other various forms of short wavelength radiation. Accordingly, the x-ray resists of the present invention may also be useful when exposed to such other short wavelength actinic radiation.

Very highly resolved submicron images on the order of about 0.2 to 1 micron were capable of being produced with the photosensitive compositions using an x-ray source containing a palladium target, operated at 20,000 volts, manufactured by Micronix.

It is generally accepted that x-rays typically generate secondary electrons within the photoresist. These secondary electrons interact with the photoacid generator to produce a halogen acid capable of catalyzing the crosslinking of an acid hardening resin. Therefore, it follows that in addition to x-rays the photosensitive compositions of the present invention, employing the selected x-ray sensitive photoacid generators, have the capability of being imaged using other short wavelength radiations such as electron beams. Electron beam imaging of these photosensitive compositions may be used to prepare photomasks where extremely high resolution on the order of about 0.1 micron is desired.

The acid hardening resin system which can be combined with the photoacid generators described herein are described in detail in my copending application Ser. No. 616,518. The acid hardening resin system contains a polymer that crosslinks in the presence of an acid catalyst and heat. The acid hardening resin system may be prepared from a variety of aminoplast or phenoplasts in combination with compounds or low molecular weight polymers containing a plurality of hydroxyl, carboxyl, amide or imide groups. Suitable aminoplasts include: urea-formaldehyde; melamine-formaldehyde; benzoquanamine-formaldehyde; glycoluril-formaldehyde resins and combinations thereof. The aminoplasts are used in combination with a reactive hydrogen-containing compound such as a novolak resin; polyvinylphenol; polyglutarimide; poly(meth)acrylic acid copolymers; alkali soluble polyacrylaimide and polymethacrylamide copolymers; copolymers containing 2-hydroxyethyl acrylate or methacrylate; polyvinyl alcohols such as those prepared from partially hydrolyzed polyvinyl acetates; alkali soluble styrene-allylalcohol copolymers; and mixtures thereof. Preferred reactive hydrogen containing compounds used in combination with the acid hardening resin are novolak resins containing hydroxyl groups, sites for the electrophillic substitution of aromatic rings at positions ortho- or para-relative to the hydroxyl group, and a weight average molecular weight ranging from about 300 to 100,000 and more preferably from about 1,000 to about 20,000.

The acid hardening resin system can also be prepared from a combination of phenoplast resins and a latent formaldehyde-generating compound. These latent formaldehyde generating compounds include s-trioxane, N(2-hydroxyethyl) oxazolidine and oxazolidinylethyl methacrylate.

The acid hardening resin system is soluble in suitable non-reacting solvents such as glycolethers including ethylene glycol monomethylether, ethylene glycol monoethylether, Propasol® P, Propasol® B and the like; Cellosolve® esters such as methyl Cellosolve® acetate, ethyl Cellosolve® acetate and acetates of Propasol® B and P and the like; aromatic hydrocarbons such as toluene, xylene and the like; ketones such as methylethyl ketone, cyclopentanone, cyclohexanone, and the like; esters such as ethyl acetate, butyl acetate, isobutyl isobutyrate, butyrolactone and the like; amides such as dimethylacetamide (DMAC), N-methylpyrrolidinone (NMP), dimethylformamide (DMF) and the like; chlorinated hydrocarbons such as ethylene dichloride chlorobenzene, ortho-dichlorobenzene and the like; nitrobenzene, dimethylsulfoxide, and mixtures of the above. The photosensitive coating solution typically contains at least 50 percent by weight solvent and preferably from about 65 to 95 percent by weight solvent.

The deep UV photosensitive compositions of the invention contain from about 3 to about 50 parts by weight aminoplast resin, about 40 to about 90 parts by weight reactive hydrogen generating compound and from about 0.1 to about 10 parts by weight of the photoacid generator or from about 3 to about 50 parts by weight phenoplast, from about 40 to about 90 parts by weight formaldehyde generating compound and about 0.1 to about 10 parts by weight photoacid generator.

The x-ray photosensitive compositions of the invention contain from about 3 to about 50 parts by weight aminoplast or phenoplast, from about 40 to about 90 parts by weight reactive hydrogen generating compound or latent formaldehyde generating compound respectively, and from about 10 to about 50 parts by weight deep UV photoacid generator.

The following examples are presented to illustrate the photosensitive compositions containing the photoacid generators in combination with acid hardening resin systems to produce aqueous developed, thermally stable and highly resolved negative images on surfaces and are not intended to limit the scope of the present invention.

EXAMPLE 1

Formation of Negative Images in deep UV by Contact Printing

To 10.0 grams of a 30% solids proprietary novolak resin (solution), Shipley Company XP-0103, was added 0.60 g of methylated melamine-formaldehyde aminoplast, Cymel® 303, and 0.73 g of a 10% solution of 1,1-bis[p-chlorophenyl]-2,2,2-trichloroethane photoacid generator dissolved in Shipley Microposit Thinner, 2.4 g Shipley Micrposit® Type A thinner was then added to produce a mixture which contained 1.99% photoacid generator (by weight of solids) and 26.73% solids. The mixture was gently agitated for 5 minutes at 25° C. to form a homogeneous solution. A three inch diameter silicon oxide wafer was vapor primed (5 min.) with hexamethydisilazane (HMDS) to remove surface moisture. A 1.0 ml aliquot was placed onto the wafe an spin-coated at 3000 pm for 60 seconds. The wafer was then placed in a forced air oven at 90° C. for 30 min (soft baking). The wafer was then placed in contact with a Shipley Target photomask using a Hybrid Technology Group Model No. L-84-5X contact printer. The coating was exposed to actinic radiation at 254 nm from a high pressure mercury vapor lamp (500 watt) fitted with an Action Research bandpass filter of peak wavelength 258.5 nm and a bandwidth of 28 nm. The wafer received a radiation exposure of 7.5. millijoule per square centimeter (mJ/cm$^2$). Following exposure and removal of the photomask, the acid latent image in the exposed regions of the coating was crosslinked by heating the coating at 90° C. for 30 min. in a forced-air oven. The images were developed in an aqueous base developer, Shipley Company Microposit® 351 developer, diluted two parts by volume with three parts by volume deionized water, for 2.75 minutes at 20° C. with mild agitation. The resultant images were 1.4 μm thick. (B) A resist situation similar to the one above was diluted to 26% solids and processed according to the procedures Example 1 to produce 0.7 μm lines and spaces.

EXAMPLE 2

Formation of Negative Image in deep UV Using a Commercial Exposure System

A resist solution of 2% 1,1-bis[p-chlorophenyl]-2,2,2,-trichloroethane was prepared in a similar manner to Experiment 1. The coating solution was taken to Perkin-Elmer research labs of South, Wilton, CT. where it was spin-coated onto an HMDS-primed five inch silicon oxide wafer at 3500×pm for 45 sec. The coating was softbaked at 90° C. for 40 min in a forced-air oven before exposure on a Perkin-Elmer Micralign® 540 aligner. A 280 nm bandpass filter of peak wavelength 280 mm and bandwidth of 50 nm was placed between the UVC deep UV lamp and the aligned mask/wafer system. The wafer was exposed to a series of five doses across the wafer surface, by changing the scan speed of the radiation. A proprietary Perkin-Elmer test pattern (on a dark-field mask) was used to image the coating to doses of 2.2, 3.9, 5.5, 7.2 and 8.8 mJ/cm² radiation. The exposed wafer was processed in a similar manner to Experiment 1 to produce approximately 0.9 μm thick images.

EXAMPLE 3

Formation of Negative Images using X-rays

A resist solution of 2% 1,1-bis-[p-chlorophenyl]-2,2,2-trichloroethane was prepared by combining 10.00 g novolak resin, 0.60 g Cymel 303, 0.73 g of a 10% solution photoacid generator dissolved in Shipley Microposit Thinner and 2.40 g thinner. The solution was spin-coated and baked onto a 4 inch wafer as described in Experiment 1, before taking to Micronix Corp. of Los Gatos, CA. At Micronix, the coating was soaked in deionized water for 10 min before placing in a prototype x-ray exposure system. Using a 2.5 KW palladium source and 25 KV which produces a sharp x-ray line at 3 Angstroms superimposed on less intense broadband of x-rays. A proprietary Micronix test metallized photomask was placed between the x-ray source and the wafer stage. The side of the mask facing the source was exposed to a helium atmosphere, and the side opposite exposed to normal atmosphere. The wafer was then placed under the mask at a gap of 40 microns and exposed for 60 min. using an air purge over the wafer surface. This was equivalent to a dose of 131 mJ/cm². After a 93° C., 23 min postbake, the 1.3 μm thick coating was developed until the unexposed response were clear (2–3 min.) in a 3/2 solution of Shipley 351 aqueous developer/deionized water to produce 0.96 μm images (80% initial thickness retained).

The developed coating had a uniformity comparable to a conventional DCOPA x-ray resist and a ring of thinner coating at the outer edge.

The 1.0 μm bars were not resolved, which indicated over-exposure, however, image profile was superior to DCOPA (which is slanted and rounded). Table 1 presents a key to the photoacid generators employed in combination with acid hardening resins to produce negative images according to the following examples.

The procedure used to prepare the photosensitive composition, coating and negative image are the same as described in Example 1 with deep UV and Example 2 with x-ray with the changes identified in Tables 2-4.

TABLE 1

| PHOTOACID GENERATORS | |
|---|---|
| PHOTOACID GENERATOR NUMBER | NAME |
| 1. | 1,1-bis[p-chlorophenyl]-2,2,2-trichloroethane |
| 2. | 1,1-bis[p-methoxyphenyl]-2,2,2-trichloroethane |
| 3. | 1,2,5,6,9,10-hexabromocyclododecane |
| 4. | 1,10-dibromodecane |
| 5. | 1,1,-bis[p-chlorophenyl]-2,2-dichloroethane |
| 6. | 4,4'-dichloro-a-(trichloromethyl)benzhydrol |
| 7. | hexachlorodimethylsulfone |
| 8. | 2-chloro-6-(trichloromethyl)pyridine |
| 9. | O,O-diethyl-O-(3,5,6,-trichloro-2-pyridyl)phosphorothioate |
| 10. | 1,2,3,4,5,6-hexachlorocyclohexane (B-isomer) |
| 11. | N(1,1-bis[p-chlorophenyl]-2,2,2-trichloroethyl)acetamide |
| 12. | tris[2,3,-dibromopropyl]isocyanurate |
| 13. | 1,1-bis[p-chlorophenyl]-2,2-dichloroethylene |
| 14. | UVE1014 onium salt (manufactured by General Electric Co.) |
| 15. | FC-508 onium salt (UV activated Expoxy Curing Agent) Mfg. by 3M Corp. |
| 16. | trichloroacetamide |
| 17. | trifluoracetamide |
| 18. | 1,4-dibromobutanol |
| 19. | o-nitrobenzaldehyde |
| 20. | trifluoromethylphenol |
| 21. | bis[o-nitrobenzyl]azelate |
| 22. | 2'-nitrobenzanilide |
| 23. | 1,1-dichloro-2,2-bis[p-ethylphenyl]ethane |
| 24. | tris[2,3-dichloropropyl]phosphate |
| 25. | 1,4-bis[trichloromethyl]benzene |
| 26. | tris[2-chloroethyl]phosphate |
| 27. | dibenzylsulfoxide |
| 28. | 9-chloromethylanthracene |
| 29. | alpha-tetraloneoxime p-toluenesulfonate |

Table 2 presents the results of experiments performed with a number of deep UV photoacid generators in combination with acid hardening resins photoresist using deep UV exposure. These photosensitive compositions produced aqueously developable, thermally stable, highly resolved negative images.

TABLE 2

PHOTOSENSITIVE COMPOSITIONS USING DEEP UV PHOTOACID GENERATORS

| EX. | P.G.[1] | WEIGHT % | AHRS[2] | WEIGHT RATIO AHRS/P.G | COATING THICKNESS, um[7] | EXPOSURE WAVELENGTH (nm) | EXPOSURE DOSE mJ/cm² | MASK | POST-BAKE °C./HRS. | DEVELOP MIN. | DEVELOP DILUTION (with water) | HEAT TREATMENT °C./MIN. |
|---|---|---|---|---|---|---|---|---|---|---|---|---|
| 4 | 1 | 25 | NOV[3] C303[4] | 5/1 | 0.7 | 254 | 1 | R[5] | 90/0.5 | — | 0.5/1 351 | — |
| 5 | 1 | 10 | NOV C303 | 5/1 | 2.7 | 254 | 63 | 3D[6] | 90/0.5 | 5.75 | 1/1 351 | — |
| 6 | 1 | 5 | NOV C303 | 5/1 | 0.9 | 280 | 2.5 | NEG. TONE | 90/0.5 | — | 1.5/1 351 | — |
| 7 | 1 | 2 | NOV C303 | 5/1 | 2.5 | 254 | 63 | 3D | 90/0.5 | 1.6 | 1/1 351 | — |
| 8 | 1 | 2 | NOV C303 | 5/1 | 0.9 | 280 | 3–4 | POS. TONE | 90/0.5 | — | 1.5/1 351 | — |
| 9 | 1 | 2 | NOV C303 | 5/1 | 1.0 | 254 | 8 | R | 90/0.5 | 1.6 | 1.5/1 351 | — |
| 10 | 1 | 2 | NOV C303 | 5/1 | 2.2 | 254 | 10 | R | 90/0.5 3.25 | 4.7 | 1.5/1 351 | — |
| 11 | 1 | 2 | NOV C303 | 5/1 | 1.3 | 254 | 8 | R | 90/0.5 | 2.5— | 1.5/1 351 | 300/15 |
| 12 | 1 | 2 | NOV C303 | 5/1 | 1.5 | 254 | 7.5 | R | 90/0.5 | 2.45 | 1.5/1 351 | 300/15 |
| 13 | 1 | 2 | NOV C303 | 5/1 | 1.5 | 254 | 7.5 | R | 90/0.5 | 3.0 | 1.5/1 351 | 300/15 |

TABLE 2-continued

PHOTOSENSITIVE COMPOSITIONS USING DEEP UV PHOTOACID GENERATORS

| EX. | P.G.[1] | WEIGHT % | AHRS[2] | WEIGHT RATIO AHRS/P.G | COATING THICKNESS, um[7] | EXPOSURE WAVELENGTH (nm) | EXPOSURE DOSE mJ/cm$^2$ | MASK | POST-BAKE °C./HRS. | DEVELOP MIN. | DEVELOP DILUTION (with water) | HEAT TREATMENT °C./MIN. |
|---|---|---|---|---|---|---|---|---|---|---|---|---|
| 14 | 1 | 2 | NOV C303 | 8/1 | 1.3 | 254 | 8 | R | 90/0.5 | 2.5 | 1.5/1 351 | — |
| 15 | 1 | 2 | NOV C303 | 8/1 | 1.4 | 254 | 7.5 | R | 90/0.5 | 2.0 | 1.5/1 351 | 300/15 |
| 16 | 1 | 2 | NOV C303 | 4/1 | 1.5 | 254 | 8 | R | 90/0.5 | 3.0 | 1.5/1 351 | — |
| 17 | 1 | 2 | NOV C303 | 4/1 | 1.5 | 254 | 7.5 | R | 90/0.5 | 2.2 | 1.5/1 351 | 300/15 |
| 18 | 1 | 2 | NOV C303 | 2.7/1 | 1.6 | 254 | 8 | R | 90/0.5 | 2.7 | 1.5/1 351 | — |
| 19 | 1 | 2 | NOV C303 | 2.7/1 | 1.6 | 254 | 7.5 | R | 90/0.5 | 1.8 | 1.5/1 351 | 300/15 |
| 20 | 1 | 2 | NOV C303 | 1.9/1 | 1.7 | 254 | 8 | R | 90/0.5 | 2.0 | 1.5/1 351 | — |
| 21 | 1 | 2 | NOV C303 | 1.9/1 | 1.7 | 254 | 7.5 | R | 90/0.5 | 1.5 | 1.5/1 351 | 300/15 |
| 22 | 1 | 2 | NOV C303 | 1.6/1 | 1.9 | 254 | 8 | R | 90/0.5 | 1.5 | 1.5/1 351 | — |
| 23 | 1 | 2 | NOV C303 | 1.6/1 | 1.7 | 254 | 7.5 | R | 90/0.5 | 1.0 | 1/5/1 351 | — |
| 24 | 1 | 1 | NOV C303 | 5/1 | 2.5 | 254 | 63 | 3D | 90/0.5 | 4.7 | 2/1 351 | — |
| 25 | 1 | 1 | NOV C303 | 5/1 | 1.6 | 254 | 5 | 3D | 90/0.5 | 2-3 | 2/1 351 | — |
| 26 | 1 | 1 | NOV C303 | 5/1 | 2.6-2.8 | 254 | 60 | 3D | 90/0.5 | 4.5 | 2/1 351 | — |
| 27 | 1 | 1 | NOV C303 | 5/1 | 1.3 | 220 | 23 | STEN. | 90/0.5 | — | 1.5/1 351 | — |
| 28 | 1 | 1 | NOV C303 | 5/1 | 1.3 | 220 | 115 | STEN. | 90/0.5 | — | 1.5/1 351 | — |
| 29 | 1 | 1 | NOV B60[7] | 5/1 | 1.6 | 254 | 63 | 3D | 90/0.5 | 1.2 | 2/1 351 | — |
| 30 | 1 | 1 | NOV C1123[8] | 5/1 | 1.5 | 254 | 63 | 3D | 90/0.5 | 7.5 | 2/1 351 | — |
| 31 | 1 | 1 | PVP[9] C303 | 5/1 | 1.9 | 254 | 10 | 3D | 90/0.5 | 9.0 | 11/1 351 | — |
| 32 | 2 | 5 | NOV C303 | 5/1 | 0.9 | 280 | 2.5 | NEG. TONE | 90/0.5 | — | 1.5/1 351 | — |
| 33 | 2 | 2 | NOV C303 | 5.1 | 1.5 | 254 | 5 | R | 100/25 | 5.5 | 1.5/1 351 | — |
| 34 | 2 | 2 | NOV C303 | 5/1 | 1.5 | 254 | 9 | R | 90° C./0.5 | 2.2 | 1.5/1 351 | — |
| 35 | 2 | 2 | NOV C303 | 5/1 | 1.5 | 254 | 4 | R | 100/15 | 3.6 | 1.5/1 351 | — |
| 36 | 2 | 2 | NOV C303 | 5/1 | 1.3 | 220 | 23 | STEN | 90/0.5 | 3.6 | 1.5/1 351 | — |
| 37 | 2 | 2 | NOV C303 | 5/1 | 0.9 | 280 | 8-9 | POS. TONE | 90/0.5 | — | 1.5/1 351 | — |
| 38 | 2 | 2 | NOV C303 | 5/1 | 1.0 | 254 | 3 | R | 90/0.5 | 1.9 | 1.5/1 351 | — |
| 39 | 2 | 1 | NOV C303 | 5/1 | 1.6 | 254 | 63 | 3D | 90/0.5 | 2.05 | 2/1 351 | — |
| 40 | 2 | 1 | NOV C303 | 5/1 | 1.5 | 254 | 5 | R | 100/30 | 7.25 | 2/1 351 | — |
| 41 | 2 | 1 | NOV C303 | 5/1 | 1.5 | 254 | 5 | R | 100/25 | 4.5 | 1.5/1 351 | — |
| 42 | 3 | 5 | NOV C303 | 5/1 | 0.94 | 254 | 10 | 3D | 90/30 | 3.0 | 2/1 351 | — |
| 43 | 3 | 5 | NOV C303 | 5/1 | 0.9 | 280 | 10 | NEG. TONE | 90/30 | 3.0 | 2/1 351 | — |
| 44 | 3 | 2 | NOV C303 | 5/1 | 1.3 | 220 | 23 | STEN. | 90/30 | — | 1.5/1 351 | — |
| 45 | 3 | 2 | NOV C303 | 5/1 | 1.3 | 220 | 115 | STEN. | 90/30 | — | 1.5/1 351 | — |
| 46 | 3 | 2 | NOV C303 | 5/1 | 0.9 | 280 | 9-10 | POS. TONE | 90/30 | — | 1.5/1 351 | — |
| 47 | 3 | 2 | NOV C303 | 5/1 | 1.0 | 254 | 5 | R | 90/30 | 1.2 | 1.5/1 351 | — |
| 48 | 4 | 5 | NOV C303 | 5/1 | 0.91 | 254 | 10 | 3D | 90/30 | 2.3 | 2/1 351 | — |
| 49 | 5 | 5 | NOV C303 | 5/1 | 1.0 | 254 | 10 | 3D | 90/30 | 4.0 | 2/1 351 | — |
| 50 | 5 | 5 | NOV C303 | 5/1 | 1.0 | 254 | 20 | | 90/30 | 4.4 | 2/1 351 | — |

TABLE 2-continued

PHOTOSENSITIVE COMPOSITIONS USING DEEP UV PHOTOACID GENERATORS

| EX. | P.G.[1] | WEIGHT % | AHRS[2] | WEIGHT RATIO AHRS/P.G | COATING THICKNESS, um[7] | EXPOSURE WAVELENGTH (nm) | EXPOSURE DOSE mJ/cm$^2$ | MASK | POST-BAKE °C./HRS. | DEVELOP MIN. | DILUTION (with water) | HEAT TREATMENT °C./MIN. |
|---|---|---|---|---|---|---|---|---|---|---|---|---|
| 51 | 6 | 25 | NOV C303 | 5/1 | 0.5 | 254 | 1 | R | 90/30 | — | 0.5/1 | 351 — |
| 52 | 6 | 25 | NOV C303 | 5/1 | 1.0 | 254 | 1 | R | 90/30 | — | 0.5/1 | 351 — |
| 53 | 6 | 20 | NOV C303 | 5/1 | 0.6 | 254 | 15 | R | 90/30 | — | 0.5/1 | 351 — |
| 54 | 6 | 15 | NOV C303 | 5/1 | 0.6 | 254 | 2.5 | R | 90/30 | — | 0.5/1 | 351 — |
| 55 | 6 | 10 | NOV C303 | 5/1 | 0.6 | 254 | 3.5 | R | 90/30 | — | 0.5/1 | 351 — |
| 56 | 6 | 5 | NOV C303 | 5/1 | 1.0 | 254 | 10 | NEG. TONE | 90/30 | — | 1.5/1 | 351 — |
| 57 | 6 | 5 | NOV C303 | 5/1 | 0.9 | 280 | 2.5 | POS. TONE | 90/30 | — | 1.5/1 | 351 — |
| 58 | 6 | 2 | NOV C303 | 5/1 | 0.9 | 280 | 7.8 | POS. TONE | 90/30 | — | 1.5/1 | 351 — |
| 59 | 6 | 1.9 | NOV C303 | 5/1 | 1.0 | 254 | 5.5 | R | 90/30 | 1.9 | 1.5/1 | 351 — |
| 60 | 7 | 5 | NOV C303 | 5/1 | 1.0 | 254 | 1.0 | 3D | 90/30 | 4.2 | 2/1 | 351 — |
| 61 | 8 | 5 | NOV C303 | 5/1 | 1.0 | 254 | 1.0 | 3D | 90/30 | 2.5 | 2/1 | 351 — |
| 62 | 9 | 5 | NOV C303 | 5/1 | 1.0 | 254 | 1.0 | 3D | 90/30 | 3.0 | 2/1 | 351 — |
| 63 | 10 | 5 | NOV C303 | 5/1 | 1.0 | 254 | 1.0 | 3D | 90/30 | 1.8 | 2/1 | 351 — |
| 64 | 11 | 5 | NOV C303 | 5/1 | 1.0 | 254 | 6 |  | 90/30 | 6.0 | 2/1 | 351 — |
| 65 | 12 | 5 | NOV C303 | 5/1 | 1.0 | 254 | 6 |  | 90/30 | 2.2 | 2/1 | 351 — |
| 66 | 12 | 5 | NOV C303 | 5/1 | 0.9 | 280 | 10 | NEG. TONE | 90/30 | — | 1.5/1 | 351 — |
| 67 | 12 | 2 | NOV C303 | 5/1 | 0.9 | 280 | 9–10 | POS. TONE | 90/30 | — | 1.5/1 | 351 — |
| 68 | 12 | 2 | NOV C303 | 5/1 | 1.0 | 254 | 11.5 | R | 90/30 | 1.5 | 1.5/1 | 351 — |
| 69 | 12 | 2 | NOV C303 | 5/1 | 1.0 | 254 | 11.0 | R | 90/30 | 1.7 | 1.5/1 | 351 — |
| 70 | 13 | 5 | NOV C303 | 5/1 | 1.0 | 254 | 6 |  | 90/30 | 3.8 | 2/1 | 351 — |
| 71 | 14 | 5 | NOV C303 | 5/1 | 1.0 | 254 | 9.6 |  | 90/0.5 | 3.4 | 2/1 | 351 — |
| 72 | 14 | 5 | NOV C303 | 5/1 | 2.9 | 254 | 2.0 | 3D | 90/0.5 | 4.25 | 1/1 | 351 — |
| 73 | 14 | 5 | NOV C303 | 5/1 | 2.9 | 365 | 1000 | 3D | 90/0.5 | 7.7 | 1.5/1 | 351 — |
| 74 | 14 | 5 | NOV C303 | 5/1 | 0.9 | 280 | 10 | NEG. TONE | 90/0.5 | — | 1.5/1 | 351 — |
| 75 | 14 | 5 | NOV C303 | 5/1 | 2.9 | 254 | 2.0 | 3D | 90/0.5 | 3.4 | 1/1 | 351 — |
| 76 | 14 | 5 | NOV C303 | 5/1 | 2.9 | 365 | 1000 | 3D | 90/0.5 | 7.7 | 1.5/1 | 351 — |
| 77 | 14 | 5 | NOV C303 | 5/1 | 0.9 | 280 | 10 | NEG. TONE | 90/0.5 | — | 1.5/1 | 351 — |
| 78 | 14 | 4 | NOV C303 | 5/1 | 2.8 | 365 | 2000 | 3D | 90/0.5 | 3.75 | 1/1 | 351 — |
| 79 | 14 | 4 | NOV C303 | 5/1 | 10.0 | 254 | 150 | 3D | 90/0.5 | 7.2 | 0.5/1 | 351 — |
| 80 | 14 | 4 | NOV C303 | 5/1 | 2.6 | 365 | 750 | 3D | 90/0.5 | 3.5 | 2/1 | 351 — |
| 81 | 14 | 4 | NOV C303 | 5/1 | 9.6 | 365 | 2800 | 3D | 90/0.5 | 8.0 | 0.5/1 | 351 — |
| 82 | 14 | 4 | NOV C303 | 5/1 | 1.0 | 365 | 14155 | R | 90/0.5 | 2.2 | 1.5/1 | 351 — |
| 83 | 14 | 2 | NOV C303 | 5/1" | 0.9 | 280 | 10–18 | POS. TONE | 90/0.5 | — | 1.5/1 | 351 — |
| 84 | 15 | 5 | NOV C303 | 5/1 | 1.0 | 254 | 8.4 |  | 90/0.5 | 2.7 | 2/1 | 351 — |
| 85 | 15 | 5 | NOV C303 | 5/1 | 2.8 | 254 | 2.0 | 3D | 90/0.5 | 4.0 | 1/1 | 351 — |
| 86 | 15 | 5 | NOV C303 | 5/1 | 2.7 | 365 | 1000 | 3D | 90/0.5 | 3.7 | 1/1 | 351 — |
| 87 | 15 | 4 | NOV C303 | 5/1 | 9.2 | 365 | 2800 | 3D | 90/0.5 | 9.5 | 0.5/1 | 351 — |

TABLE 2-continued

PHOTOSENSITIVE COMPOSITIONS USING DEEP UV PHOTOACID GENERATORS

| EX. | P.G.[1] | WEIGHT % | AHRS[2] | WEIGHT RATIO AHRS/P.G | COATING THICKNESS, um[7] | EXPOSURE WAVELENGTH (nm) | EXPOSURE DOSE mJ/cm$^2$ | MASK | POST-BAKE °C./HRS. | DEVELOP MIN. | DILUTION (with water) | HEAT TREATMENT °C./MIN. |
|---|---|---|---|---|---|---|---|---|---|---|---|---|
| | | | C303 | | | | | | | | | |

[1]Photoacid Generator (See Table 1 for key to Photoacid Generator)
[2]Acid Hardening Resin Systems
[7](microns)
[3]NOV is Shipley Co. XP103 cresol-formaldehyde novolak resin.
[4]C303 is Cymel 303
[5]R is regular photomask example 1.
[6]3D is attenuated mask according to my related and copending application entitled Microplastic Structures and Method of Manufacture.
[7]B60 is Beetle ® 60 urea/formaldehyde resin
[8]C1123 is Cymel ® 1123 glycoluril resin
[9]PVP is polyvinylphenol Table 3 presents the comparative experimental results of photosensitive compositions utilizing photoacid generators and acid hardening resins following the experimental procedure of example 1, except as indicated, which did not produce acceptable negative images.

Table 4 present the results of photosensitive compositions employing the photoacid generators and acid hardening resin systems using x-ray exposure which produced thermally stable, aqueously developable, negative images.

TABLE 3

COMPARATIVE EXAMPLES DEEP UV

| EX. | P.G. | WEIGHT % | AHRS | WEIGHT RATIO AHRS/P.G | COATING THICKNESS, um | EXPOSURE WAVELENGTH (nm) | EXPOSURE DOSE mJ/CM$^2$ | MASK | POST-BAKE °C./MINS. | DEVELOP MIN. | DILUTION (with water) | HEAT TREATMENT °C./MIN. |
|---|---|---|---|---|---|---|---|---|---|---|---|---|
| 88 | 16 | 5 | NOV C303 | 5/1 | 0.96 | 254 | 10 | 3D | 90/30 | 27 | 1/1 | 351 |
| 89 | 17 | 5 | NOV C303 | 5/1 | 0.94 | 254 | 10 | 3D | 90/30 | 6.1 | 1/1 | 351 |
| 90 | 18 | 5 | NOV C303 | 5/1 | 0.98 | 254 | 10 | 3D | 90/30 | 1.9 | 1/1 | 351 |
| 91 | 19 | 5 | NOV C303 | 5/1" | 0.90 | 254 | 10 | 3D | 90/30 | 1.6 | 2/1 | 351 |
| 92 | 20 | 5 | NOV C303 | 5/1 | 0.95 | 254 | 10 | 3D | 90/30 | 3.6 2.5 | 2/1 + 1/1 | 351 |
| 93 | 21 | 5 | NOV C303 | 5/1 | 0.91 | 254 | 10 | 3D | 90/30 | 1.4 | 2/1 | 351 |
| 94 | 22 | 5 | NOV C303 | 5/1 | 0.97 | 254 | 10 | 3D | 90/30 | 1.3 | 2/1 | 351 |
| 95 | 23 | 5 | NOV C303 | 5/1 | 1.0 | 254 | 10 | 3D | 90/30 | 4.5 | 2/1 | 351 |
| 96 | 24 | 5 | NOV C303 | 5/1 | 1.0 | 254 | 36 | | 90/30 | 2.8 | 2/1 | 351 |
| 97 | 25 | 5 | NOV C303 | 5/1 | 1.0 | 254 | 60 | | 90/30 | 2.4 | 5/1 | 351 |
| 98 | 26 | 5 | NOV C303 | 5/1 | 1.0 | 254 | 60 | | 90/30 | 1.2 | 2/1 | 351 |
| 99 | 27 | 5 | NOV C303 | 5/1 | 0.96 | 254 | 10 | 3D | 90/30 | 1.9 | 2/1 | 351 |
| 100 | 28 | 2 | NOV C303 | 5/1 | 1.3 | 254 | 150 | | 90/30 | 10 | 2/1 | 351 |
| 101 | 28 | 2 | NOV C303 | 5/1 | 1.3 | 365 | 200 | | 90/30 | 10 | 2/1 | 351 |
| 102 | 29 | 4 | NOV C303 | 5/1 | 0.9 | 254 | 60 | | 90/30 | 5 | 2/1 | 351 |

TABLE 4

PHOTOSENSITIVE COMPOSITIONS USING X-RAY PHOTOACID GENERATORS

| EX. | P.G. | WEIGHT % | AHRS | WEIGHT RATIO AHRS/P.G | COATING THICKNESS, um | EXPOSURE WAVELENGTH (nm) | EXPOSURE DOSE mJ/cm$^2$ | A.E[10] %/ | Post-BAKE °C./MINS. | DEVELOP MIN. | DEVELOP DILUTION (with water) |
|---|---|---|---|---|---|---|---|---|---|---|---|
| 103 | 1 | 25 | NOV C303 | 5/1 | 0.99 | 3 | 11 | 3/D$_2$ | 90/30 | 4 | 0.5/1 351 |
| 104 | 1 | 30 | NOV C303 | 5/1 | 1.12 | 3 | 11 | 3/D$_2$ | 90/30 | 6 | 0.5/1 351 |
| 105 | 1 | 25 | NOV C303 | 5/1 | 0.86 | 3 | 11 | AIR | 90/30 | 3.9 | 0.5/1 351 |
| 106 | 1 | 25 | NOV C303 | 5/1 | 0.85 | 3 | 33 | AIR | 90/30 | 5 | 0.5/1 + |

TABLE 4-continued
PHOTOSENSITIVE COMPOSITIONS USING X-RAY PHOTOACID GENERATORS

| EX. | P.G. | WEIGHT % | AHRS | WEIGHT RATIO AHRS/P.G | COATING THICKNESS, um | EXPOSURE WAVELENGTH (nm) | DOSE mJ/cm² | A.E | Post-BAKE °C./MINS. | DEVELOP MIN. | DILUTION (with water) |
|---|---|---|---|---|---|---|---|---|---|---|---|
| 107 | 1 | 20 | NOV C303 | 5/1 | 0.94 | 3 | 11 | 3/D₂ | 90/30 | 1.25 4 | R 351 0.5/1 351 |
| 108 | 1 | 20 | NOV C303 | 5/1 | 0.80 | 3 | 11 | 3/D₂ | 90/30 | 2.5 | 0.5/1 351 |
| 109 | 1 | 20 | NOV C303 | 5/1 | 0.80 | 3 | 11 | 3/D₂ | 100/30 | 2.2 | 0.5/1 351 |
| 110 | 1 | 20 | NOV C303 | 5/1 | 0.80 | 3 | 11 | H₂O SOAK + AIR | 90/30 | 2.40. | 5/1 351 |
| 111 | 1 | 20 | NOV C303 | 5/1 | 0.80 | 3 | 11 | H₂O SOAK + AIR | 100/30 | 2.2 | 0.5/1 351 |
| 112 | 1 | 15 | NOV C303 | 5/1 | 0.89 | 3 | 11 | 3/D₂ | 90/30 | 2.4 | 0.5/1 351 |
| 113 | 1 | 5 | NOV C303 | 5/1 | 10–1.2 | 3 | | He | 90/30 | — | 1.5/1 351 |
| 114 | 1 | 5 | NOV C303 | 5/1 | 10–1.2 | 3 | 52 | 3/D₂ | 90/23 | — | 0.5/1 351 |
| 115 | 1 | 2 | NOV C303 | 5/1 | 10–1.2 | 3 | 131 | 3/D₂ | 90°/45 | — | 0.5/1 351 |
| 116 | 1 | 2 | NOV C303 | 5/1 | 10–1.2 | 3 | 131 | AIR | 90/23 | — | 0.5/1 351 |
| 117 | 1 | 2 | NOV C303 | 5/1 | 10–1.2 | 3 | 131 | H₂O SOAK + AIR | 95/23 | — | 0.5/1-351 |
| 118 | 2 | 25 | NOV C303 | 5/1 | 1.1 | 3 | 11 | AIR | 90/30 | 0.25 | 0.5/1 351 |
| 119 | 2 | 25 | NOV C303 | 5/1 | 0.96 | 3 | 33 | AIR | 90/30 | 2.25 3.5 | 0.5/1 + R 351 |
| 120 | 2 | 2 | NOV C303 | 5/1 | 1.0–1.2 | 3 | | He | 90/30 | — | 1.5/1 351 |
| 121 | 6 | 25 | NOV C303 | 5/1 | 0.97 | 3 | 33 | AIR | 90/30 | 1.2 3.9 | 0.5/1 351 + NEAT |
| 122 | 6 | 25 | NOV C303 | 5/1 | 0.95 | 3 | 33 | AIR | 90/30 | 8.75 | 0.5/1 351 |
| 123 | 6 | 2 | NOV C303 | 5/1 | 1.0–1.2 | 3 | 131 | AIR | 95/25 | 8.75 | 1.5/1 351 |
| 124 | 9 | 2 | NOV C303 | 5/1 | 1.0–1.2 | 3 | 3 | He | 90/30 | | 1.5/1 351 |
| 125 | 10 | 2 | NOV C303 | 5/1 | 1.0–1.2 | 3 | 3 | He | 90/30 | | 0.5/1 351 |
| 126 | 12 | 25 | NOV C303 | 5/1 | 0.94 | 3 | 11 | 3/D₂ | 90/30 | 3 | 0.5/1 351 |
| 127 | 12 | 2 | NOV C303 | 5/1 | 1.0–1.2 | 3 | 11 | He | 90/30 | | 1.5/ 351 |
| 128 | 24 | 25 | NOV C303 | 5/1 | 0.94 | 3 | 33 | AIR | 90/30 | 0.75 | 0.5/1 351 |
| 129 | 11 | 2 | NOV C303 | 5/1 | 1.0–1.2 | 3 | 33 | He | 90/30 | — | 1.5/1 351 |

¹⁰is Ambient Exposure

Table 5 presents the comparative experimental results of photosensitive compositions utilizing x-ray photoacid generators and acid hardening resins following the experimental procedure of example 3, except as indicated, which did not produce acceptable negative images.

TABLE 5
COMPARATIVE EXAMPLE X-RAY

| EX. | P.G. | WEIGHT % | AHRS | WEIGHT RATIO AHRS/P.G | COATING THICKNESS, um | EXPOSURE WAVELENGTH (nm) | DOSE mJ/cm² | A.E | POSTBAKE °C./HRS. | DEVELOP MIN. | DILUTION (with water) |
|---|---|---|---|---|---|---|---|---|---|---|---|
| 130 | 26 | 25 | NOV C303 | 5/1 | .87 | 3 | 11 | 3/D₂ | 90/30 | .25 | 1.5/1 351 |

What is claimed is:

1. A short wavelength actinic radiation sensitive negative photoresist comprising as its essential ingredients which together total 100 percent: from about 99.9 to about 50 weight percent of an acid hardening resin system selected from the group consisting of a combination of an aminoplast resin and at least one reactive hydrogen containing compound, where said reactive hydrogen containing compound is selected from the group consisting of novolak, polyvinylphenol, polyglutarimide, poly(meth)acrylic acid copolymers, alkali soluble polyacrylic amide and polymethacrylic amide copolymers, copolymers containing 2-hydroxyethyl (meth) acrylate, polyvinyl alcohol; alkali soluble styrene-allyl alcohol copolymers and mixtures thereof, or a phenoplast resin and at least one formaldehyde generating compound, and from about 0.1 to about 50 weight percent of a photoacid generating compound, where the photoacid generating compound is selected from the group of halogenated organic compounds which (a) absorb short wavelength actinic radiation having a wavelength less than about 299 nanometers selected from deep ultraviolet, x-ray and electron beam radiation;
(b) are compatible with the acid hardening resin system in solvents wherein said acid hardening resin system is soluble;
(c) generate a halogen acid when the photoresist is exposed to said short wavelength actinic radiation;
(d) permits the unexposed photoresist to be developed using an aqueous base; and
(e) permits the crosslinking of said acid hardening resin system in the exposed photoresist when said exposed photoresist is heated to elevated temperatures to form a thermally stable negative image, wherein the concentration of said photoacid generating compound in said photoresist is at least 0.1 weight percent when deep ultraviolet radiation having a dosage of less than 10 mJ/Cm$^2$ is used to expose the photoresist having a thickness less than about 2 microns and wherein the concentration of said photoacid generating compound in said photoresist is at least 10 weight percent when x-ray radiation having a dosage of less than about 130 mJ/Cm$^2$ is used to expose the photoresist;

and wherein the amount of aminoplast or phenoplast in said photoresist is from about 3 to about 50 weight percent and the amount of reactive hydrogen generating compound or formaldehyde generating compound is from about 40 to about 90 weight percent.

2. The negative photoresist of claim 1, where said photoacid generating compound is sensitive to deep ultraviolet light and is selected from the group consisting of:

1,1-bis [p-chlorophenyl]-2,2,2-trichloroethane;
1,1-bis [p-methoxyphenyl]-2,2,2-trichloroethane;
1,2,5,6,9,10-hexabromocyclododecane;
1,10-dibromodecane;
1,1-bis[p-chlorophenyl]-2,2-dichloroethane;
4,4,$^1$-dichloro-2-(trichloromethyl) benzhydrol or 1,1-bis(chlorophenyl)2-2,2-trichloroethanol;
hexachlorodimethyl sulfone;
2-chloro-6-(trichloromethyl) pryidine;
0,0-diethyl-0-(3,5,6-trichloro-2-pyridyl) phosphorothioate;
1,2,3,4,5,6-hexachlorocyclohexane;
N(1,1-bis [p-chlorophenyl]-2,2,2-trichoroethyl)acetamide,
tris [2,3-dibromopropyl] isocyanurate;
1,1-bis [p-chlorophenyl]-2,2-dichloroethylene;
and their isomers, analogs, homologs and residual compounds.

3. The negative photoresist composition of claim 1, where the photoacid generating compound is selected from the group consisting of 1,1-bis[p-chlorophenyl]-2,2,2-trichloroethane, 1,1-bis[p-methoxyphenyl]-2,2,2-trichloroethane, 1,1-bis[p-chlorophenyl]-2,2,2-trichloroethan ol, tris isocyanurate, and isomers, analogs, homologs and residual compounds thereof.

* * * * *